(12) United States Patent
Mrvos et al.

(10) Patent No.: US 7,423,073 B2
(45) Date of Patent: Sep. 9, 2008

(54) RADIATION CURABLE COMPOSITIONS HAVING IMPROVED FLEXIBILITY

(75) Inventors: James M. Mrvos, Lexington, KY (US); Girish S. Patil, Lexington, KY (US); Karthik Vaideeswaran, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 413 days.

(21) Appl. No.: 10/995,806

(22) Filed: Nov. 23, 2004

(65) Prior Publication Data

US 2006/0111477 A1    May 25, 2006

(51) Int. Cl.
C08F 2/46 (2006.01)
C08F 2/50 (2006.01)
C08J 3/28 (2006.01)
B41J 2/135 (2006.01)
B41J 2/16 (2006.01)

(52) U.S. Cl. ............... 522/170; 522/162; 522/166; 347/65; 347/63

(58) Field of Classification Search ............... 347/65, 347/20, 63; 522/109, 110, 111, 112, 90, 522/96, 168, 170, 162, 166, 71, 74, 83
See application file for complete search history.

(56) References Cited

U.S. PATENT DOCUMENTS

| | | | |
|---|---|---|---|
| 4,426,431 A * | 1/1984 | Harasta et al. ............... 430/14 |
| 6,136,497 A | 10/2000 | Melisaris et al. | |
| 6,193,359 B1 | 2/2001 | Patil | |
| 6,194,024 B1 | 2/2001 | Arldt et al. | |
| 6,265,132 B1 | 7/2001 | Eramo, Jr. et al. | |
| 6,350,792 B1 | 2/2002 | Smetana et al. | |
| 6,391,140 B1 | 5/2002 | Patil | |
| 6,413,697 B1 | 7/2002 | Melisaris et al. | |
| 6,629,756 B2 | 10/2003 | Wang et al. | |
| 6,709,805 B1 | 3/2004 | Patil | |
| 2002/0177073 A1 | 11/2002 | Melisaris et al. | |
| 2005/0260522 A1* | 11/2005 | Weber et al. ............... 430/270.1 |

FOREIGN PATENT DOCUMENTS

JP          07022751    *    1/1995

OTHER PUBLICATIONS

Johnson et al., Improving the Process Capability of SU-8, Part II, <<http://www.microchem.com/resources/su8_process_capability_paper_2.pdf>>, MicroChem Corp.

Uvacure® Cationic Cure Technology, <<http://www.chemicals.ucb-group.com/b_units/b2indust/radcure/uvacure/uvacure.html>>, The UCB Group.

Johnson et al., Improving the Process Capability of SU-8, Part II, <<http://www.microchem.com/resources/su8_process_capability_paper_2.pdf>>, MicroChem Corp., 2001.

Uvacure® Cationic Cure Technology, <<http://www.chemicals.ucb-group.com/b_units/b2indust/radcure/uvacure/uvacure.html>>, The UCB Group, 2004.

* cited by examiner

*Primary Examiner*—Sanza L McClendon
(74) *Attorney, Agent, or Firm*—Dinsmore & Shohl, LLP

(57) ABSTRACT

A radiation curable resin composition having improved flexibility. The radiation curable composition having from about 5 to about 50 weight percent of a difunctional polymeric compound; from about 1 to about 10 weight percent of a photoinitiator; from about 1 to about 10 weight percent of a flexibilizer agent, wherein the flexibilizer agent has a molecular weight ranging from about 400 to about 10,000; and about 30 to about 90 weight percent of the non-photoreactive solvent, wherein the weight percents are based on the total weight of the resin composition. Ink jet print heads and ink jet printing apparatusess comprising ink jet print heads utilizing the radiation curable resin compositions are also included.

14 Claims, 2 Drawing Sheets

RADIATION CURABLE COMPOSITIONS HAVING IMPROVED FLEXIBILITY

TECHNICAL FIELD

Figure 1:
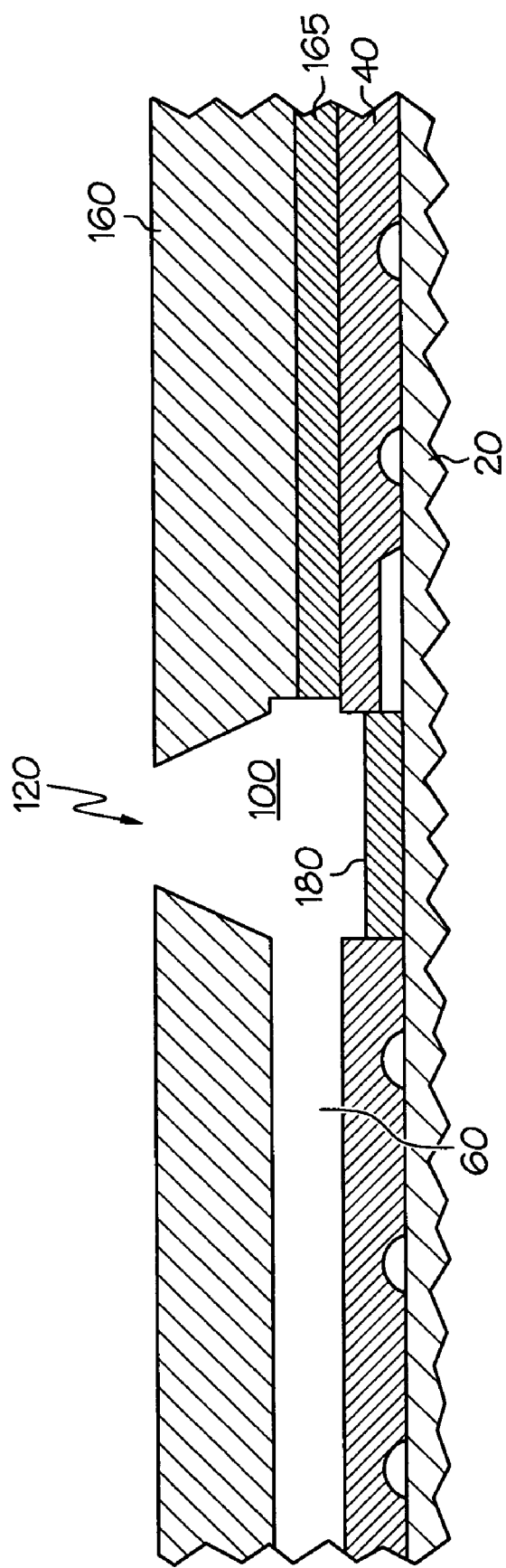

This invention relates to radiation curable compositions having improved flexibility, particularly useful as photoresists in formation of ink jet print heads.

BACKGROUND OF THE INVENTION

The ink jet print head of an ink jet printing apparatus generally consists of an orifice plate containing orifices or injection parts for discharging ink for recording on a substrate, ink passageways connecting the orifices to an ink supply and an energy imparting device for ejecting ink from the print head through the orifices. The energy for discharging the ink during recording is generated in most cases by resistance elements or piezoelectric devices.

Methods for making the ink passageways for ink jet print heads include, for example, forming fine grooves in a thin layer of glass, metal, or plastic by cutting or etching and then bonding another thin layer of material onto the layer having such grooves formed thereon to form liquid passageways. Another method involves forming grooves in a photosensitive resin coated on a substrate containing the energy imparting device by photolithographic techniques. Once the grooves are formed in the photosensitive resin another thin layer of material is attached to the grooved resin to form, for example, nozzle plates.

Negative photoresists are materials that become insoluble in developing solutions when exposed to optical radiation. The epoxy based negative photoresists are typically very rigid, and as such are susceptible to cracking during manufacturing of the print heads. As such, there is a need for negative photoresist formulations with increased flexibility and crack resistance.

SUMMARY OF THE INVENTION

The present invention comprises photoresist compositions having enhanced flexibility and crack resistance. The photoresist compositions of the present invention are particularly useful in the manufacture of print heads. More specifically, this invention relates to compositions, print heads and ink jet printing apparatuses comprising a radiation curable composition having improved flexibility.

One embodiment of the present invention is a radiation curable composition having improved flexibility. The composition comprises from about 5 to about 50 weight percent of a difunctional polymeric compound; from about 1 to about 10 weight percent of a photoinitiator; from about 1 to about 10 weight percent of a flexibilizer agent, wherein the flexibilizer agent has a molecular weight ranging from about 400 to about 10,000; and from about 30 to about 90 weight percent of a non-photoreactive solvent, wherein the weight percents are based on the total weight of the radiation curable composition.

Another embodiment of the present invention is an ink jet print head having ink passageways connected to an ink discharging outlet provided on a substrate, the passageways being formed by subjecting a layer of a radiation curable resin composition to exposure of radiation in a pattern to form a cured region of the resin composition and removing the uncured resin composition region from the layer, the radiation curable resin composition comprising: from about 5 to about 50 weight percent of a difunctional polymeric compound; from about 1 to about 10 weight percent of a photoinitiator; from about 1 to about 10 weight percent of a flexibilizer agent; wherein the flexibilizer agent has a molecular weight ranging from about 400 to about 10,000; and from about 30 to about 90 weight percent of a non-photoreactive solvent, wherein the weight percents are based on the total weight of the resin composition.

Yet another embodiment of the present invention is an ink jet printing apparatus. The ink jet printing apparatus comprises a frame; a print head having ink passageways for ejecting ink, wherein the ink passageways are formed by subjecting a layer of a radiation curable resin composition to exposure of radiation in a pattern to form a cured region of the resin composition and removing the uncured resin composition region from the layer, the radiation curable resin composition comprising: from about 5 to about 50 weight percent of a difunctional polymeric compound; from about 1 to about 10 weight percent of a photoinitiator; from about 1 to about 10 weight percent of a flexibilizer agent, wherein the flexibilizer agent has a molecular weight ranging from about 400 to about 10,000; and from about 30 to about 90 weight percent of a non-photoreactive solvent, wherein the weight percents are based on the total weight of the resin composition. The ink jet printing apparatus further comprises a print head carrier assembly including a carriage for carrying the print head, the print head carrier assembly being mounted to the frame, the print head carrier assembly effecting a reciprocating movement of the print head through a printing zone during a printing operation.

BRIEF DESCRIPTION

Figure 2:
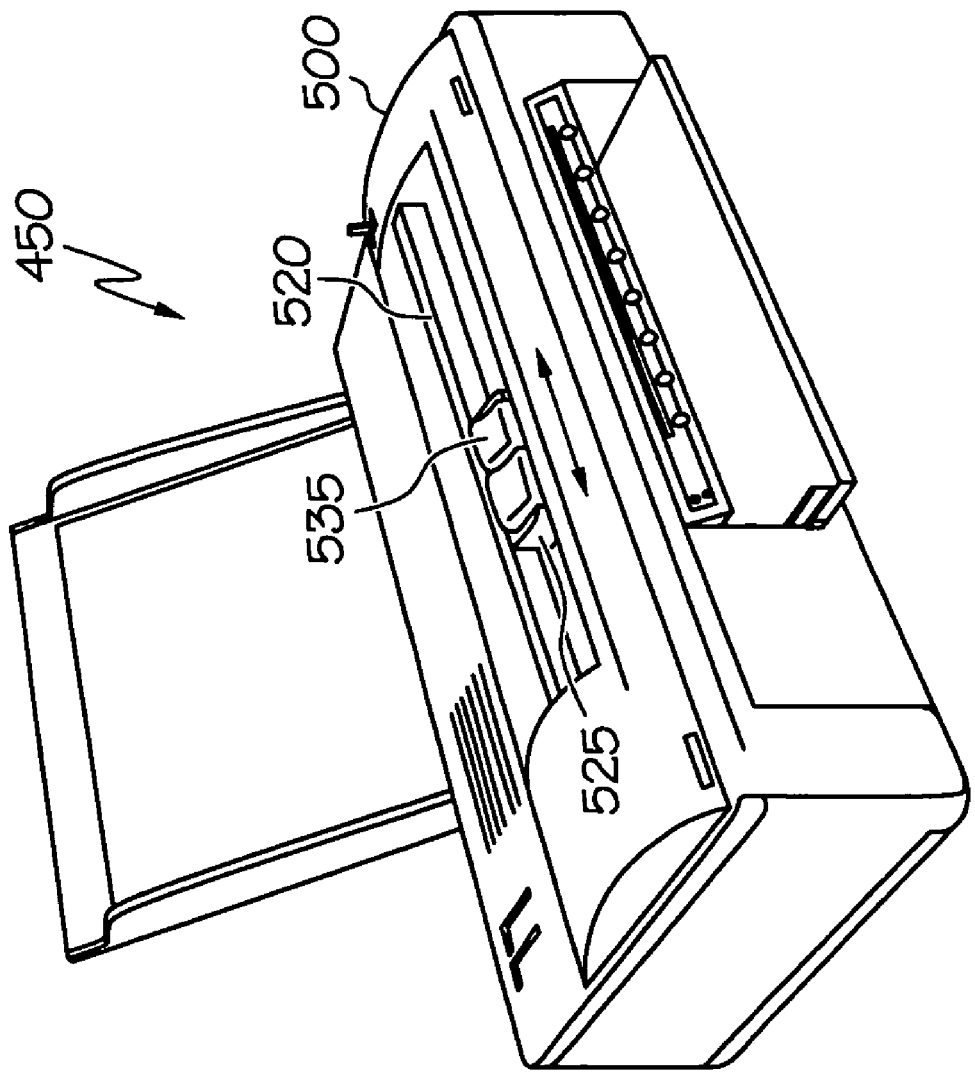

While the specification concludes with claims particularly pointing out and distinctly claiming the present invention, it is believed that the same will be better understood from the following description taken in conjunction with the accompanying drawings in which:

FIG. 1 is a schematic illustration of an ink jet print head according to a first exemplary embodiment of the present invention; and FIG. 2 is a schematic illustration of an ink jet printing apparatus according to a second exemplary embodiment of the present invention.

The embodiments set forth in the drawings are illustrated in nature and not intended to be limiting of the invention defined by the claims. Moreover, individual features of the drawings and the invention will be more fully apparent and understood in view of the detailed description.

DETAILED DESCRIPTION OF THE INVENTION

Reference will now be made in detail to various embodiments which are illustrated in the accompanying drawings, wherein like numerals indicate similar elements throughout the views.

One embodiment of the present invention is a radiation curable resin composition having improved flexibility. The composition comprises from about 5 to about 50 weight percent of a difunctional polymeric compound; from about 1 to about 10 weight percent of a photoinitiator; from about 1 to about 10 weight percent of a flexibilizer agent, wherein the flexibilizer agent has a molecular weight ranging from about 400 to about 10,000; and from about 30 to about 90 weight percent of the non-photoreactive solvent, wherein the weight percents are based on the total weight of the resin composition.

The first component of the resin composition is a difunctional polymeric compound. The difunctional polymeric compound may comprise a difunctional epoxy compound which includes monomeric difunctional epoxy compounds and polymeric difunctional epoxy compounds which may vary in the nature of their backbone and substituent groups. In one embodiment, the difunctional polymeric compound has a hydroxy group as a substituent. Other exemplary substituent groups include, for example, halogens, ester groups, ethers, sulfonate groups, siloxane groups, nitro groups, and phosphate groups. The number average molecular weight (MN) of the difunctional polymeric compound may vary from about 75 to about 100,000. In one embodiment the difunctional polymeric compound comprises a liquid. Alternatively, one or more solid difunctional polymeric compounds may be utilized in a mixture, wherein the final mixture is in a liquid phase.

Difunctional epoxy compounds which may be used include diglycidly ethers of Bisphenol A (e.g., those available under the trade designations "EPON 828", "EPON 1004", "EPON 1001F", "EPON SU-8" and "EPON 1010" from Shell Chemical Company, "DER-331", "DER-332", and "DER-334" from Dow Chemical Company), 3,4-epoxycyclohexylmethyl-3, 4-epoxycyclohexene carboxylate (e.g., "ERL-4221" from Union Carbide Corp.), 3, 4-epoxy-6-methylcyclohexylmethyl-3, 4-epoxy-6-methylcyclohexene carboxylate (e.g., "ERL-4201" from Union Carbide Corp.), bis (3,4-epoxy-6-methylcyclohexylmethyl) adipate (e.g., "ERL-4289" from Union Carbide Corp.), bis(2,3-epoxycyclopentyl) ether (e.g., "ERL-0400" from Union Carbide Corp.) In one exemplary embodiment the difunctional polymeric compound is present in an amount from about 5 to about 50 weight percent. In another exemplary embodiment, the difunctional polymer compound is present from about 10 to about 20 weight percent.

The second component of the resin composition is a photoinitiator capable of generating a cation such as an aromatic complex salt photoinitiator which may be selected from onium salts of a Group VA element, onium salts of a Group VIA element, and aromatic halonium salts. These complex salts, upon being exposed to ultraviolet radiation or electron beam irradiation, are capable of generating moieties which initiate reaction with epoxides. In one exemplary embodiment, the photoinitiator is present in the composition in an amount from about 1 to about 10 weight percent. Alternatively, the photoinitiator is present in the composition in the amount from about 1.5 to about 5 weight percent, based on total weight of the resin composition.

Exemplary aromatic complex salt photoinitiators include aromatic iodonium complex salts and aromatic sulfonium complex salts. Examples of the aromatic iodonium complex salt aromatic complex salt photoinitiators include:
diphenyliodonium tetrafluoroborate
di(4-methylphenyl)iodonium tetrafluoroborate
phenyl-4-methylphenyliodonium tetrafluoroborate
di(4-heptylphenyl)iodonium tetrafluoroborate
di(3-nitrophenyl)iodonium hexafluorophosphate
di(4-chlorophenyl)iodonium hexafluorophosphate
di(naphthyl)iodonium tetrafluoroborate
di(4-trifluoromethylphenyl)iodonium tetrafluoroborate
diphenyliodonium hexafluorophosphate
di(4-methylphenyl)iodonium hexafluorophosphate
diphenyliodonium hexafluoroarsenate
di(4-phenoxyphenyl)iodonium tetrafluoroborate
phenyl-2-thienyliodonium hexafluorophosphate
3,5-dimethylpyrazolyl-4-phenyliodonium hexafluorophosphate
diphenyliodonium hexafluoroantimonate
2,2'-diphenyliodonium tetrafluoroborate
di(2,4-dichlorophenyl)iodonium hexafluorophosphate
di(4-bromophenyl)iodonium hexafluorophosphate
di(4-methoxyphenyl)iodonium hexafluorophosphate
di(3-carboxyphenyl)iodonium hexafluorophosphate
di(3-methoxycarbonylphenyl)iodonium hexafluorophosphate
di(3-methoxysulfonylphenyl)iodonium hexafluorophosphate
di(4-acetamidophenyl)iodonium hexafluorophosphate
di(2-benzoethienyl)iodonium hexafluorophosphate In one exemplary embodiment of the present invention, the photoinitiator is either diaryliodonium hexafluorophosphate or diaryliodonium hexafluoroantimonate, or a mixture thereof. These salts are particularly useful because, in general, they are typically more thermally stable, promote faster reaction, and are more soluble in inert organic solvents than are other aromatic iodonium salts of complex ions.

Examples of aromatic sulfonium complex salt aromatic complex salt photoinitiators include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluoroantimonate
tris(4-phenoxyphenyl)sulfonium hexafluorophosphate
di(4-ethoxyphenyl)methylsulfonium hexafluoroarsenate
4-acetoxy-phenyldiphenylsulfonium tetrafluoroborate
tris(4-thiomethoxyphenyl)sulfonium hexafluorophosphate
di(methoxysulfonylphenyl)methylsulfonium hexafluoroantimonate
di(methoxynapththyl)methylsulfonium tetrafluoroborate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
methyl(n-methylphenothiazinyl)sulfonium hexafluoroantimonate
phenylmethylbenzylsulfonium hexafluorophosphate In another exemplary embodiment of the present invention, the photoinitiator comprises triaryl-substituted salts such as triphenylsulfonium hexafluorophosphate. The triaryl-substituted salts are beneficial because they are typically more thermally stable than the mono- and diaryl substituted salts thereby providing a one-part system with long shelf life. The triaryl-substituted complex salts are also more amenable to dye sensitization. Consequently, the use of such complex salts results in compositions which are much more useful in applications where near ultraviolet and visible light are used for exposure. If desired, the composition may be prepared in shelf stable concentrate form (i.e. with high levels of complex salt) which is suitable for later dilution to a more commercially practical coating composition.

One exemplary photoinitiator capable of generating a cation is a mixed triarylsulfonium hexafluoroantimonate salt, commercially available from Union Carbide (UVI-6974).

The third component of the resin composition is a flexibilizer agent, the flexibilizer agent has a molecular weight ranging from about 400 to about 10,000. Exemplary flexibilizer agents comprise commercially available saturated and unsaturated long chain diols or polyether polyols; caprolactone polyols; polyether diamines, polyester polyols; and acrylate or urethane acrylate oligomers. Exemplary polyols include polypropylene glycol based polyols; polytetramethylene ether glycol; poly(oxypropylene) glycol; polybutadiene glycol; polyethylene adipate glycol; polyethylene propylene adipate glycol; polybutadiene adipate glycol; o-phthalate-1,6-hexanediol polyester polyol; diethylene glycol initiated caprolactone; trimethylol propane initiated caprolactone; neopentyl glycol initiated caprolactone; 1,4-butanediol initiated caprolactone; 1,6-hexanediol initiated caprolactone; polyethylene adipate glycol; polybutylene adipate glycol; diethylene glycol initiated caprolactone; saturated and unsaturated hydrocarbon polyols; hydroxyl-terminated liquid isoprene rubber (LIR); hydroxyl-terminated polybutadiene polyol and mixtures thereof. Exemplary unsaturated long chain diols include epoxidized hydroxyl terminated polybutadiene, commercially available from Sartomer Company as "Poly bd 600" series. Additional commercially available exemplary flexibilizer agents comprise: epoxidized polybutadiene PBD 600E and 603 E from Sartomer Company; OH Terminated polybutadiene LBH 2000 (Krasol) from Sartomer Company; Polyol TP30 and Polyol TP200 from Perstorp; Boltorn series with mono or poly functionality from Perstorp; PTMG extended caprolactone diols (e.g. Capa 7401) from Solvay Caprolactones; DOW P-series of polyglycols (linear polymers containing two terminal hydroxyl groups) from DOW Chemical; DOW PT-series polyglycols and DOW EP-series of polyglycol copolymers from DOW Chemical; SYNCUR series of low viscosity reactive polyether polyols from Synair Corporation; and Poly-G, Poly-L and Poly-Q polyether diols, triols and tetrols from Arch Chemicals and Poly-A polyether amines from Arch Chemicals.

In one exemplary embodiment, the flexibilizer comprises from about 1 to about 10 weight percent of the total weight of the resin composition. Alternatively, in another exemplary embodiment, the flexibilizer agent comprises from about 2 to about 5 weight percent of the total weight of the present composition.

The fourth component of the resin composition is a non-photoreactive solvent. This solvent is limited only to the extend that the desired components, prior to curing are soluble in it. Exemplary non-photoreactive solvents include gamma-butyrolactone, $C_{1-6}$ acetates, tetrahydrofuran, low molecular weight ketones, mixtures thereof and the like.

In one exemplary embodiment, the non-photoreactive solvent is present in the composition in an amount from about 30 to about 90 weight percent of the total weight of the resin composition. In an alternative embodiment, the non-photoreactive solvent comprises from about 45 to about 75 weight percent of the total weight of the resin composition.

In another exemplary embodiment, the resin composition may include up to about 35 weight percent of an acrylate or methacrylate polymer which is derived from at least one acrylate or methacrylate monomer. The polymer may be a homopolymers, a copolymer, or a blend. The term "polymer" as used herein is meant to include other oligomers (e.g., materials having a number average molecular weight as low as about 1,000) as well as high polymers (which may have a number average molecular weight ranging up to about 1,000,000). In one exemplary embodiment, the number average molecular weight of the acrylate or methacrylate polymer is in the range from about 10,000 to about 60,000, and in an alternative exemplary embodiment is in the range from about 20,000 to about 30,000.

Another embodiment of the present invention, as depicted in FIG. 1, is an ink jet print head. The ink jet print head comprises a substrate 20, a radiation cured resin layer 40 on the substrate 20, an ink ejection chamber 100, an orifice 120, and a passageway 60. The passageway 60 is in fluid flow communication with the orifice 120. The print head contains an energy imparting device 180 for discharging the ink through the orifice 120. Orifice 120 is in the nozzle plate 160 which is bonded 165 to the upper side of resin layer 40. Any known bonding material to one skilled in the art may be utilized to bond the nozzle plate to the resin layer. One exemplary bonding material 165 comprises phenolic butyral. The energy for discharging ink is generated by applying electronic signals to the energy imparting device 180 as desired. These energy imparting devices include heat resistance elements or piezoelectric elements which are arranged in predetermined patterns on the substrate 20. As one skilled in the art will appreciate, the radiation cured resin layer can be utilized in various ink jet print head topographies with the resin layer ranging in thickness between about 1 micron and about 30 microns. Exemplary topographies include: 1) the resin layer being utilized as a plane rising layer with no flow features in the resin layer and having a nozzle plate with flow features ablated into the nozzle plate; 2) the resin layer having flow features formed into the resin layer and having a nozzle plate with no flow features; or 3) the resin layer having flow features formed into the resin layer and having a nozzle plate with flow features ablated into the nozzle plate.

In one exemplary embodiment, the flexibilizer agent is reacted on terminating groups of the difunctional polymeric compound. Alternatively, the flexibilizer agent may be added as an additive to the polymer composition.

In another embodiment of the present invention, the radiation curable resin, composition further comprises from about 0.5 to about 20 weight percent of a multifunctional second crosslinking polymeric compound. In one exemplary embodiment, the second multifunctional epoxy compound increases the crosslinking density thereby increasing resolution and improving resistance to solvent swelling. The type of second multifunctional epoxy compound is generally not limited, as long as it is a compound capable of resulting in the desired crosslinking. Exemplary second multifunctional epoxy compounds include, for example, those which are the reaction product of phenol; aldehydes and epoxides like "DEN-431", "DEN-438", "DEN-439" (commercially available from Dow Plastics). In an alternative embodiment, the radiation curable composition comprises from about 1 to about 10 weight percent of the multifunctional second crosslinking polymeric compound, or alternatively from about 1 to about 5 weight percent based on the total weight of the resin composition.

Another embodiment of the present invention, as depicted in FIG. 2, is an ink jet printing apparatus, such as a printer 450. The ink jet printer 450 comprises a printer frame 500; a print head 535 having ink passageways for ejecting ink, wherein the ink passageways are formed by subjecting a layer of radiation curable resin composition to exposure of radiation in a pattern to form a cured region of the resin composition and removing the uncured resin composition region from the layer, the radiation curable resin composition comprising: from about 5 to about 50 weight percent of a difunctional polymeric compounds; from about 1 to about 10 weight percent of a photoinitiator; from about 1 to about 10 weight percent of a flexibilizer agent, wherein the flexibilizer agent has a molecular weight ranging from about 400 to about 10,000; and from about 30 to about 90 weight percent of a non-photoreactive solvent, wherein the weight percents are based on the total weight of the resin composition. The ink jet printer 450 further comprises a print head carrier assembly 520 including a carriage 525 for carrying the print head 535, the print head carrier assembly 520 being mounted to the printer frame 500, the print head carrier assembly 520 effecting a reciprocating movement of the print head 535 through a printing zone during a printing operation.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of the invention.

What we claim:

1. An radiation curable resin composition, comprising:
   (a) about 5 to about 50 weight percent of a difunctional polymeric compound;
   (b) about 1 to about 10 weight percent of a photoinitiator;
   (c) about 1 to about 10 weight percent of a flexibilizer agent, wherein the flexibilizer agent has a molecular weight ranging from about 400 to about 10,000; and
   (d) about 30 to about 90 weight percent of a non-photoreactive solvent, wherein the weight percents are based on the total weight of the resin composition;
   wherein the flexibilizer agent is selected from the group consisting of: polypropylene gycol based polyols, polytetramethylene ether glycol, poly(oxypropylene) glycol, polybutadiene glycol, polyethylene adipate glycol, polyethylene propylene adipate glycol, polybutadiene adipate glycol, o-pthalate-1,6-hexanediol polyester polyol, diethylene glycol initiated caprolactone, trimethylol propane initiated caprolactone, neopentyl glycol initiated caprolactone, 1,4-butanediol initiated caprolactone, 1-6-hexanediol initiated caprolactone, polyethylene adipate glycol, polybutylene adipate glycol, diethylene glycol initiated caprolactone, and mixtures thereof.

2. The composition of claim 1, wherein the flexibilizer agent is reacted on terminating groups of the difunctional polymeric compound.

3. The composition of claim 1, wherein the flexibilizer agent is added as an additive to the composition.

4. The composition of claim 1, further comprising from about 0.5 to about 20 weight percent of a multifunctional second crosslinking polymeric compound.

5. The composition of claim 1, wherein the difunctional polymeric compound comprises an epoxy compound.

6. The composition of claim 1, further comprising a silane having a functional group capable of reacting with at least one member selected from (a) or (b).

7. The composition of claim 1, wherein the photoinitiator is capable of generating a cation.

8. The composition of claim 1, wherein the photoinitiator is capable of generating a free radical.

9. The composition of claim 1, wherein the flexibilizer agent comprises epoxydized hydroxyl terminated polybutadine resin.

10. The composition of claim 1, wherein the composition has a molecular weight ranging from about 500 to about 10,000.

11. The composition of claim 1, wherein the flexibilizer agent comprises polypropylene glycol based polyols.

12. The composition of claim 4, wherein the multifunctional crosslinking compound comprises a multifunctional crosslinking epoxy compound.

13. An ink jet print head having ink passage ways connected to an ink discharging outlet provided on a substrate, the passage ways being formed by subjecting a layer of a radiation curable resin composition to exposure of radiation in a pattern to form a cured region of the resin composition and removing the uncured resin composition region from the layer, the radiation curable resin composition comprising:
   (a) about 5 to about 50 weight percent of a difunctional polymeric compound;
   (b) about 1 to about 10 weight percent of a photoinitiator;
   (c) about 1 to about 10 weight percent of a flexibilizer agent, wherein the flexibilizer agent has a molecular weight ranging from about 400 to about 10,000 and wherein the flexibilizer agent is selected from the group consisting of: polypropylene glycol based polyols, polytetramethylene ether glycol, poly(oxypropylene) glycol, polybutadiene glycol, polyethylene adipate glycol, polyethylene propylene adipate glycol, polybutadiene adipate glycol, o-pthalate-1,6-hexanediol polyester polyol, diethylene glycol initiated caprolactone, trimethylol propane initiated caprolactone, neopentyl glycol initiated caprolactone, 1,4-butanediol initiated caprolactone, 1-6-hexanediol initiated caprolactone, polyethylene adipate glycol, polybutylene adipate glycol, diethylene glycol initiated caprolactone, and mixtures thereof; and
   (d) about 30 to about 90 weight percent of a non photoreactive solvent, wherein the weight percents are based on the total weight of the resin composition.

14. An ink jet printer, comprising:
   a printer frame;
   a print head having ink passage ways for ejecting ink, wherein the ink passage ways are formed by subjecting a layer of a radiation curable resin composition to exposure of radiation in a pattern to form a cured region of the resin composition and removing the uncured resin composition region from the layer, the radiation curable resin composition comprising:
   (a) about 5 to about 50 weight percent of a difunctional polymeric compound;
   (b) about 1 to about 10 weight percent of a photoinitiator;
   (c) about 1 to about 10 weight percent of a flexibilizer agent, wherein the flexibilizer agent has a molecular weight ranging from about 400 to about 10,000 and wherein the flexibilizer agent is selected from the group consisting of: polypropylene glycol based polyols, polytetramethylene ether glycol, poly(oxypropylene) glycol, polybutadiene glycol, polyethylene adipate glycol, polyethylene propylene adipate glycol, polybutadiene adipate glycol, o-pthalate-1,6-hexanediol polyester polyol, diethylene glycol initiated caprolactone, trimethylol propane initiated caprolactone, neopentyl glycol initiated caprolactone, 1,4-butanediol initiated caprolactone, 1-6-hexanediol initiated caprolactone, polyethylene adipate glycol, polybutylene adipate glycol, diethylene glycol initiated caprolactone, and mixtures thereof; and
   (d) about 30 to about 90 weight percent of a non photoreactive solvent, wherein the weight percents are based on the total weight of the resin composition;
   a print head carrier assembly including a carriage for carrying the print head, the print head carrier assembly being mounted to the printer frame, the print head carrier assembly effecting a reciprocating movement of the print head through a printing zone during a printing operation.

* * * * *